United States Patent
Patil et al.

(10) Patent No.: US 9,715,726 B2
(45) Date of Patent: Jul. 25, 2017

(54) METHOD AND SYSTEM FOR B0 DRIFT AND RESPIRATORY MOTION COMPENSATION IN ECHO-PLANAR BASED MAGNETIC RESONANCE IMAGING

(71) Applicants: Sunil Goraksha Patil, Columbia, MD (US); Di Xu, Baltimore, MD (US)

(72) Inventors: Sunil Goraksha Patil, Columbia, MD (US); Di Xu, Baltimore, MD (US)

(73) Assignee: Siemens Healthcare GmbH, Erlangen (DE)

( * ) Notice: Subject to any disclaimer, the term of this patent is extended or adjusted under 35 U.S.C. 154(b) by 744 days.

(21) Appl. No.: 14/097,583

(22) Filed: Dec. 5, 2013

(65) Prior Publication Data

US 2015/0160321 A1 Jun. 11, 2015

(51) Int. Cl.
- *G01R 33/56* (2006.01)
- *G06T 7/00* (2017.01)
- *G01R 33/565* (2006.01)
- *G01R 33/48* (2006.01)
- *G01R 33/561* (2006.01)

(52) U.S. Cl.
CPC ........ *G06T 7/0012* (2013.01); *G01R 33/4804* (2013.01); *G01R 33/56509* (2013.01); *G01R 33/56563* (2013.01); *G01R 33/5608* (2013.01); *G01R 33/5613* (2013.01); *G01R 33/5616* (2013.01)

(58) Field of Classification Search
CPC ........ G03T 7/0012; G01R 33/5608–33/56563; G01R 33/4804; G01R 33/4828; A61B 5/00
See application file for complete search history.

(56) References Cited

U.S. PATENT DOCUMENTS

| | | | |
|---|---|---|---|
| 7,689,262 B2* | 3/2010 | Kruger | G01R 33/243 324/307 |
| 7,772,846 B2 | 8/2010 | Roland | |
| 7,911,208 B2 | 3/2011 | Reisman et al. | |
| 8,030,922 B2 | 10/2011 | Roland et al. | |
| 9,345,421 B2* | 5/2016 | Peacock, III | G01R 33/4625 |
| 2004/0140803 A1* | 7/2004 | Deimling | G01R 33/56341 324/309 |
| 2005/0237057 A1* | 10/2005 | Porter | G01R 33/56341 324/307 |
| 2008/0275331 A1* | 11/2008 | Tseng | G01R 33/4804 600/411 |

(Continued)

*Primary Examiner* — Clayton E Laballe
*Assistant Examiner* — Ruifeng Pu

(57) ABSTRACT

A method and apparatus for $B_0$ correction in echo-planar (EP) based magnetic resonance image (MRI) is disclosed. Two phase images are obtained from each of a first echo-planar imaging (EPI) acquisition and a second EPI acquisition. A first susceptibility map is generated based on the two phase images obtained from the first EPI acquisition and a second susceptibility map is generated based on the two phase images obtained from the second EPI acquisition. A smooth polynomial function for modeling the $B_0$ drift and respiratory motion between the first EPI acquisition and the second EPI acquisition is initialized based on the first and second susceptibility maps. A compensated temperature map is then iteratively reconstructed based on the smooth polynomial function.

28 Claims, 7 Drawing Sheets

(56) References Cited

U.S. PATENT DOCUMENTS

| | | | |
|---|---|---|---|
| 2008/0275349 A1* | 11/2008 | Halperin | A61B 5/0205 600/484 |
| 2008/0287773 A1* | 11/2008 | Harvey | G01R 33/4804 600/412 |
| 2009/0096450 A1 | 4/2009 | Roland | |
| 2009/0096454 A1 | 4/2009 | Reisman | |
| 2009/0209846 A1* | 8/2009 | Bammer | A61B 5/055 600/421 |
| 2009/0238429 A1 | 9/2009 | Roland et al. | |
| 2010/0213938 A1* | 8/2010 | Jeong | G01R 33/5616 324/309 |
| 2011/0046498 A1* | 2/2011 | Klap | A61B 5/0205 600/534 |
| 2011/0268332 A1* | 11/2011 | Hofstetter | G01R 33/4828 382/131 |
| 2013/0307542 A1* | 11/2013 | Chen | G01R 33/5613 324/318 |
| 2015/0025360 A1* | 1/2015 | Levy | A61N 7/02 600/411 |

* cited by examiner

302

304

402

404

METHOD AND SYSTEM FOR B0 DRIFT AND RESPIRATORY MOTION COMPENSATION IN ECHO-PLANAR BASED MAGNETIC RESONANCE IMAGING

BACKGROUND OF THE INVENTION

The present invention relates to correcting $B_0$ in echo-planar (EP) based magnetic resonance imaging (MRI), and more particularly to compensating for $B_0$ drift and respiratory motion in magnetic resonance thermometry applications.

Magnetic resonance (MR) thermometry refers to tracking temperature changes in tissue of a patient using magnetic resonance image (MRI). An important application for MR thermometry is for monitoring temperature changes due to thermal therapy. Thermal therapy refers to the ablation of tissue of a patient using hot or cold temperatures. Thermal therapy can be advantageous to surgical, chemotherapy, and radiotherapy applications. Clinical examples of thermal therapy include Laser Induced Thermotherapy (LITT), High Intensity Focused Ultrasound (HIFU), Radio-frequency Ablation (RFA), and cryo-ablation.

$B_0$ refers to the main magnetic field of an MR scanner. In thermal therapy, thermal dose induced temperature changes introduce shifts in the main magnetic field $B_0$. Such $B_0$ shifts cause changes to the MR phase images. Accordingly, a temperature map can be generated showing change in temperature in a patient's tissues due to thermal therapy by comparing the MR phase images acquired before and during the thermal therapy. However, $B_0$ can be caused by multiple sources, such as the susceptibility differences between different tissue types, systematic $B_0$ drift and respiratory motion, and temperature changes. As a result, the temperature map showing temperature changes due to thermal therapy is often inaccurate, since the measured temperature often carries reflects $B_0$ shifts due to the anatomy, systematic drift and respiratory motion, in addition to the temperature change. That is, $B_0$ shifts due to the anatomy, systematic drift and respiratory motion can cause artifacts in the temperature map. Accordingly, a method of compensating for $B_0$ shifts due to the anatomy, systematic drift and respiratory motion is desirable.

BRIEF SUMMARY OF THE INVENTION

The present invention provides a method and system for $B_0$ drift and respiratory motion compensation in echo-planar (EP) based magnetic resonance imaging (MRI). Embodiments of the present invention utilize a multi-pathway echo-planar imaging (MP-EPI) sequence together with a smooth function based $B_0$ drift and respiratory motion modeling, and compensate $B_0$ shifts via an iterative reconstruction framework. For MR thermometry applications, embodiments of the present invention minimize $B_0$ drift and respiratory motion related artifacts in a temperature map, while being computationally efficient and maintaining a high temperature-to-noise ratio.

In one embodiment of the present invention, at least two phase images are obtained from each of a first echo-planar imaging (EPI) acquisition and a second EPI acquisition. A first susceptibility map is generated based on the at least two phase images obtained from the first EPI acquisition and a second susceptibility map is generated based on the at least two phase images obtained from the second EPI acquisition. A smooth polynomial function for modeling the $B_0$ drift and respiratory motion between the first EPI acquisition and the second EPI acquisition is initialized based on the first and second susceptibility maps. A compensated temperature map is iteratively reconstructed based on the smooth polynomial function.

These and other advantages of the invention will be apparent to those of ordinary skill in the art by reference to the following detailed description and the accompanying drawings.

DETAILED DESCRIPTION

Figure 1:
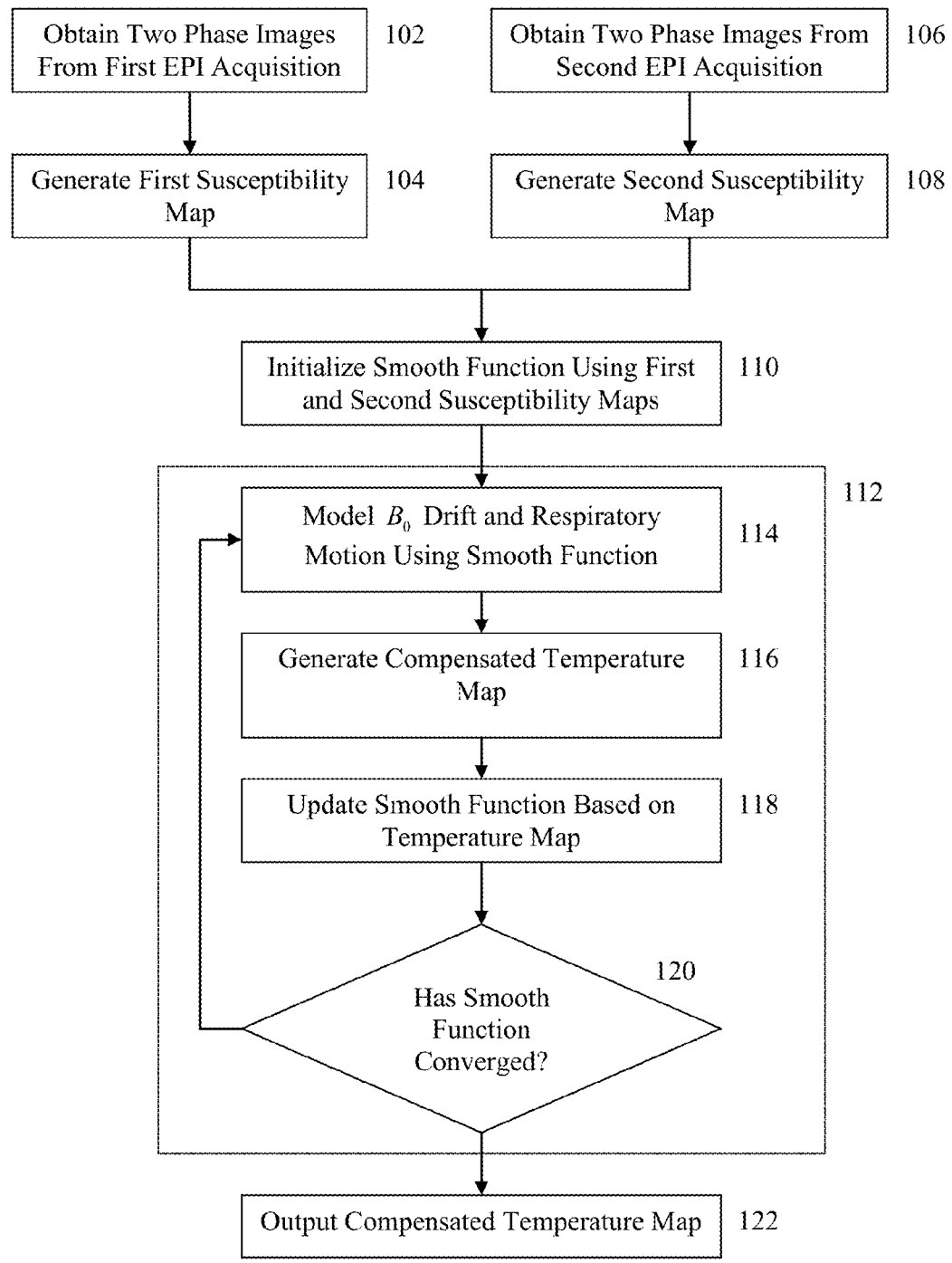
FIG. 1 illustrates a method for correcting $B_0$ in echo-planar (EP) based magnetic resonance imaging (MRI) according to an embodiment of the present invention.

The present invention relates to a method and system for $B_0$ drift and respiratory motion compensation in echo-planar (EP) based magnetic resonance imaging (MRI). EP based MRI is also referred to herein as echo-planer imaging (EPI). Embodiments of the present invention are described herein to give a visual understanding of the $B_0$ correction method. A digital image is often composed of digital representations of one or more objects (or shapes). The digital representation of an object is often described herein in terms of identifying and manipulating the objects. Such manipulations are virtual manipulations accomplished in the memory or other circuitry/hardware of a computer system. Accordingly, it is to be understood that embodiments of the present invention may be performed within a computer system using data stored within the computer system.

In thermal therapy, thermal dose induced temperature changes in a patient's tissue introduce shifts in the main magnetic field $B_0$ of an MR scanner. Such $B_0$ shifts cause changes in MR phase images. A well-known proton resonance frequency shift (PRFS) based MR thermometry method captures this temperature change by subtracting MR phase images acquired before the thermal therapy (baseline) from MR phase images acquired during the thermal therapy, and the temperature difference is calculate by:

$$\Delta T = \frac{\phi^{therm} - \phi^{bk}}{\alpha \gamma B_0 TE} = \frac{\Delta \phi}{\alpha \gamma B_0 TE}, \tag{1}$$

where $$\alpha = -0.01 \frac{ppm}{°C},$$

γ is the gyromagnetic ratio, TE is echo time, and $\phi^{bk}$ and $\phi^{therm}$ are phase images acquired at baseline and during thermal therapy, respectively. However, $B_0$ shifts ($\Delta B_0$) can be caused by multiple sources including the susceptibility differences between different tissue types ($\Delta B_{anatomy}$), systematic $B_0$ drift and respiratory motion ($\delta B$), and temperature changes ($B_c(T)$). Accordingly, the total $B_0$ shift can be expressed as:

$$\Delta B_0 = \Delta B_{anatomy} + \delta B + B_c(T). \quad (2)$$

As a result, the temperature map showing the temperature change between the baseline and thermal therapy is often inaccurate since the measured temperature change often carries the contributions from $\Delta B_{anatomy}$ and $\delta B$.

Various methods have been proposed to solve this problem, including the multi-baseline method, referenceless method, and hybrid method. However, these methods have significant limitations. The multi-baseline method mitigates measurement inaccuracy by using a library of baseline images covering the entire respiratory cycle. However, the multi-baseline method suffers from errors caused by the systematic $B_0$ drift, as well as lung and/or diaphragm motion. The referenceless method, which reconstructs a background phase (substituted for the baseline phase images) by polynomial regression, is insensitive to motion and susceptibility shifts and the existence of high susceptibility due to an organ interface can cause over-fitting and subsequently, errors of thermal dose estimation. The hybrid method attempts to address the above limitations by combining multi-baseline and referenceless methods. However, the mixture of these methods leads to substantially heavy regularization, causing high computational latency and a filtering effect on temperature maps.

Embodiments of the present invention provide a method for $B_0$ correction for EPI based sequences that overcomes many of the limitations describes above. Embodiments of the present invention utilize a multi-pathway EPI (MP-EPI) sequence together with a smooth function based $B_0$ drift respiratory motion modeling, and compensate $B_0$ shifts via an iterative reconstruction framework. For MR thermometry applications, this method minimizes $B_0$ drift and respiratory motion related artifacts, while being computationally efficient and maintaining a high temperature-to-noise ratio.

FIG. 1 illustrates a method for correcting $B_0$ in EP based MRI according to an embodiment of the present invention. The method of FIG. 1 transforms EPI images representing a patient's anatomy into a corrected temperature map showing temperatures of a patient's tissues.

Referring to FIG. 1, at step 102, two phase images of a target region of a patient are obtained from a first EPI acquisition. For example, the first acquisition can be baseline acquisition that occurs prior to thermal therapy. According to an advantageous embodiment of the present invention, an MP-EPI sequence is acquired. During each repetition time (TR), the MP-EPI sequence generates two pathways, which are from Fast Imaging with Steady-state Precession (FISP) and Reversed FISP (PSIF), respectively. Each pathway can also be referred to as an "echo". These two pathways can be used to reconstruct two phase images at each acquisition. The two phases images can be denoted as $\phi_1$ (from FISP) and $\phi_2$ (from PSIF). It is to be understood that two magnitude images can also be obtained by reconstructing a respective magnitude image from each of the pathways of the MP-EPI sequence.

Figure 2:
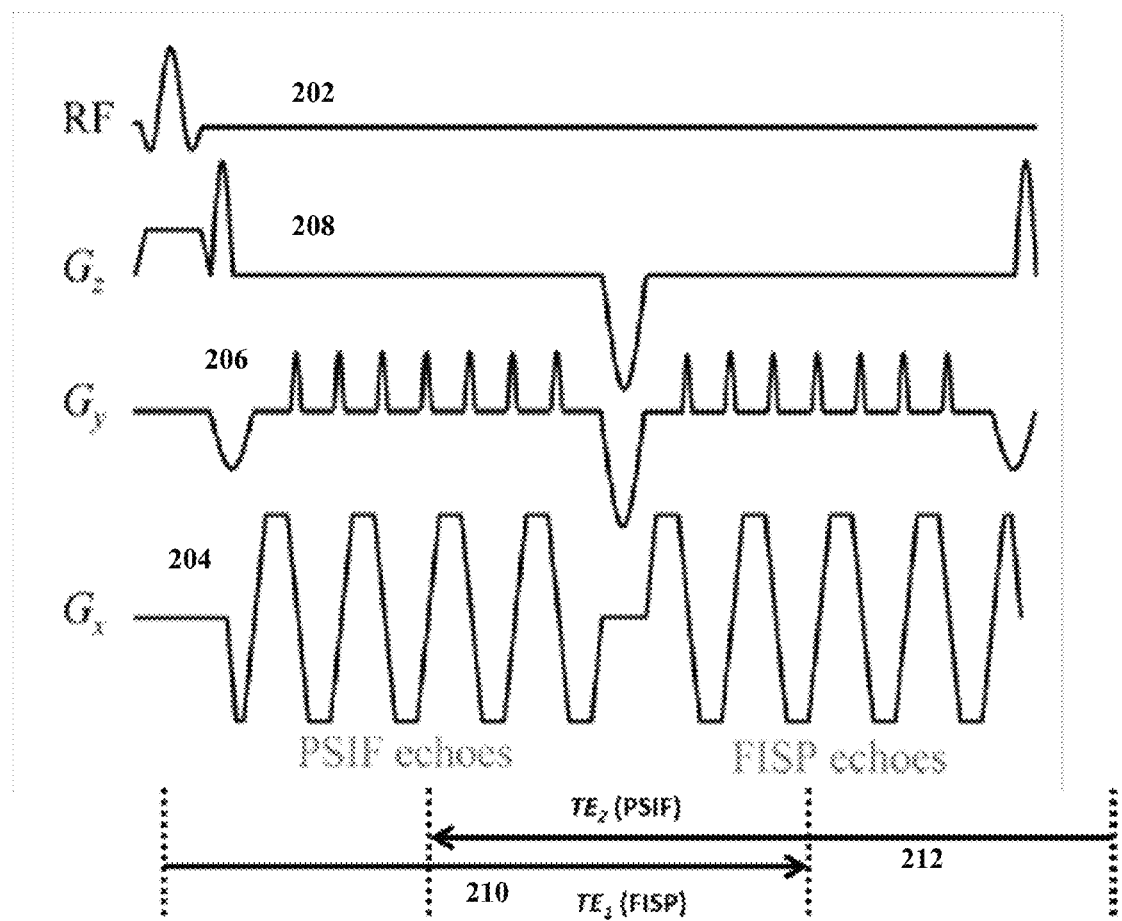
FIG. 2 illustrates an exemplary multi-pathway echo-planar imaging (MP-EPI) sequence.
Figure 3:
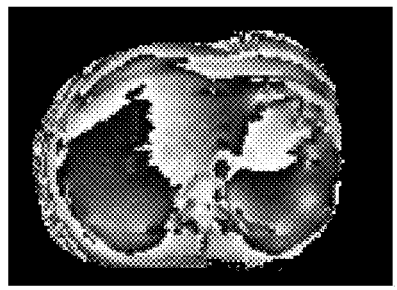
FIG. 3 illustrates exemplary phases images reconstructed from two pathways of the same MP-EPI acquisition.
Figure 3:
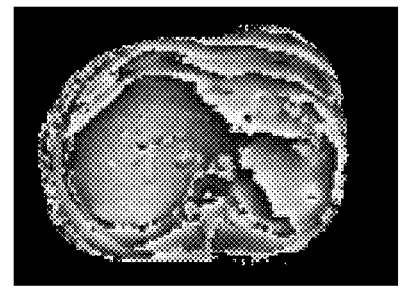

FIG. 2 illustrates an exemplary MP-EPI sequence. As shown in FIG. 2, RF shows a radio-frequency pulse 202. $G_x$ 204, $G_y$ 206, and $G_z$ 208 are gradients in the x, y, and z directions, respectively. $G_z$ 208 include slice selective gradients that are specially designed for generating the FISP and PSIF echoes. $G_x$ 204 and $G_y$ 206 encode the FISP and PSIF echoes in the x and y directions, respectively. The echo times $TE_1$ 210 and $TE_2$ 212 for the FISP echo and the PSIF echo, respectively are defined in FIG. 2, as well. FIG. 3 illustrates exemplary phases images reconstructed from two pathways of the same MP-EPI acquisition. As shown in FIG. 3, image 302 is a phase image reconstructed from the FISP echo and image 304 is a phase image reconstructed from the PSIF echo.

Returning to FIG. 1, at step 104, a first susceptibility map is generated based on the two phase images obtained from the first EPI acquisition. Two phase images reconstructed from FISP and PSIF echoes of an MP-EPI acquisition can be denoted as $\phi_1$ (from FISP) and $\phi_2$ (from PSIF). A susceptibility map $\Delta B_0$ can be calculated from two phase images as:

$$\Delta B_0 = \frac{\phi_1 - \phi_2}{\gamma(TE_1 - TE_2)}, \quad (3)$$

where $TE_1$ and $TE_2$ are the echo times for FISP and PSIF, respectively, and γ is the gyromagnetic ratio. The first susceptibility map may be generated based on the two phase images acquired in the baseline acquisition prior to thermal therapy, and therefore may also be referred to herein as the baseline susceptibility map.

Steps 102 and 104 of FIG. 1 may be performed prior to thermal therapy to obtain baseline phase images and acquire a baseline susceptibility map. These steps only need to be performed once for a particular thermal therapy. Steps 106-122 can then be repeated for each EPI acquisition used to monitor temperature during the thermal therapy.

At step 106, two phase images of the target region of the patient are obtained from a second EPI acquisition. The second acquisition can be an acquisition that occurs during thermal therapy to monitor the temperature of the tissue of the patient. According to an advantageous embodiment, the EPI acquisition is an MP-EPI acquisition that generates two pathways (echoes), one from Fast Imaging with Steady-state Precession (FISP) and another from Reversed FISP (PSIF). These two pathways can be used to reconstruct two phase images. Two magnitude images are also obtained from the second acquisition at step 106 by reconstructing a respective magnitude image from each of the pathways of the MP-EPI sequence.

At step 108, a second susceptibility map is generated based on the two phase images obtained from the second EPI acquisition. In particular, the second susceptibility map can be generated from the two phase images ($\phi_1$ and $\phi_2$) reconstructed from FISP and PSIF echoes of the second MP-EPI acquisition using Equation (3). The second susceptibility map may be generated based on the two phase images acquired at an acquisition during thermal therapy, and therefore may also be referred to herein as the thermal susceptibility map. As used herein, the first susceptibility map (baseline susceptibility map) generated at step 104 is denoted as $\Delta B_0^{bk}$ and the second susceptibility map (thermal susceptibility map) generated at step 108 is denoted as $\Delta B_0^{therm}$.

At step 110, a smooth function for modeling $B_0$ drift and respiratory motion is initialized based on the first and second susceptibility maps. As described above and shown in Equation (2), $\Delta B_0$ contains three components: $\Delta B_{anatomy}$, $\delta B$, and $B_c(T)$. When the images at the baseline acquisition and the thermal therapy acquisition are acquired at approximately the same respiratory phase, $\Delta B_{anatomy}$ can be canceled by a subtraction between the susceptibility maps at baseline ($\Delta B_0^{bk}$) and thermal therapy ($\Delta B_0^{therm}$):

$$\Delta B_0^{therm} - \Delta B_0^{bk} = (\delta B^{therm} B_c + (T))(\delta B^{bk} + B_c + (T_0))$$
$$\delta B' = B_c(T), \quad (4)$$

where $T_0$ is the temperature at baseline, and $\delta B'$ is the difference between $dB^{bk}$ and $dB^{therm}$ (i.e., the difference between the $B_0$ drift and respiratory motion between the first and second acquisitions). Each pixel at coordinate (x, y) of $\delta B'$ can be modeled by a spatially smooth varying polynomial function:

$$\delta B'(x,y) = c_0 + c_1 x + c_2 y + c_3 x^2 + c_4 xy + c_5 y^2 + \ldots, \quad (5)$$

where $c_0, c_1, \ldots$ are coefficients of the polynomial function. In an advantageous implementation, a fourth order polynomial function can be used for modeling $\delta B'$. In this case $\delta B'$ for an image of n pixels can be modeled as:

$$\delta B' = \begin{pmatrix} 1 & x_0 & y_0 & \ldots & y_0^4 \\ 1 & x_1 & y_1 & \ldots & y_1^4 \\ \vdots & \vdots & \vdots & \ddots & \vdots \\ 1 & x_n & y_n & \ldots & y_n^4 \end{pmatrix} \begin{pmatrix} c_0 \\ c_1 \\ c_2 \\ \vdots \\ c_{15} \end{pmatrix} = Xc. \quad (6)$$

At this point, the objective is to solve the coefficient vector c such that the susceptibility changes due to $B_0$ drift and respiratory motion can be characterized and then corrected. The smooth polynomial function can be initialized using the first and second susceptibility maps by the approximation: $Xc = \Delta B_0^{therm} - \Delta B_0^{bk}$. This initialization approximates that change in susceptibility due to $B_0$ drift and respiratory motion is equal to the total change in susceptibility.

After initialization of the smooth polynomial function at step 110, the method of FIG. 1 proceeds to an iterative reconstruction stage 112, in which a temperature map is iteratively reconstructed. At each iteration (i), the iterative reconstruction stage 112 performs modeling of the phase shift component $\delta B'$ (step 114), temperature map calculation (step 116), and solving a least square solution for a current iteration of the coefficient vector $c_i$. These steps are repeated until the coefficient vector of the smooth polynomial function converges. These steps of the iterative reconstruction stage 112 are described in greater detail below.

Figure 4:
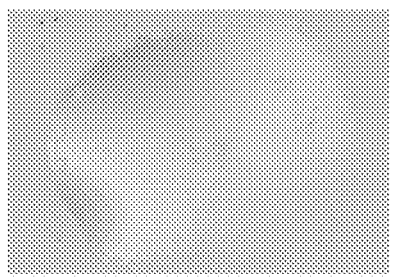
FIG. 4 illustrates exemplary results of modeling $\delta B'$ and generating a compensated temperature map in an iteration of the iterative reconstruction stage.
Figure 4:
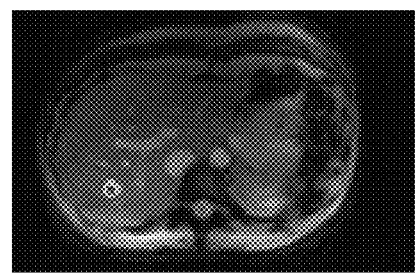

At step 114, the susceptibility change ($\delta B'$) due to $B_0$ drift and respiratory motion is modeled using the current smooth polynomial function $Xc_{i-1}$, where $c_{i-1}$ is the coefficient vector resulting from the previous iteration. For the first iteration, the coefficient vector $c_0$ is the coefficient vector of the smooth polynomial function initialized at step 110. In an advantageous embodiment, $\delta B'$ is modeled or estimated at step 114 based on the current smooth polynomial function $Xc_{i-1}$ using Equation (6). FIG. 4 illustrates exemplary results of modeling $\delta B'$ and generating a compensated temperature map in an iteration of the iterative reconstruction stage. Image 402 of FIG. 4 shows an estimate of $\delta B'$ resulting from modeling $\delta B'$ at an iteration using a current smooth polynomial function.

Returning to FIG. 1, at step 116, a compensated temperature map is generated based on the current estimate of $\delta B'$ resulting from step 114. In an advantageous implementation, the temperature map is calculated:

$$\Delta T(x, y) = \frac{\sum_{p=1}^{2} A_p(x, y)(K^{therm}\phi_p^{therm}(x, y) - K^{bk}\phi_p^{bk} - \gamma TE_p \delta B'(x, y))}{\gamma \alpha B_0 \sum_{p=1}^{2} TE_p A_p(x, y)}, \quad (7)$$

where (x, y) represents the 2D coordinate of a pixel of the temperature map, p is the index of the pathways (1: FISP, 2: PSIF), A is the magnitude image obtained from the thermal therapy EPI acquisition (second EPI acquisition), $K^{therm}$ and $K^{bk}$ are correction terms calculated as $K^{therm} = B_0/B_0^{therm}$ and $K^{bk} = B_0/B_0^{bk}$, respectively. Image 404 of FIG. 4 shows a compensated temperature map generated in an iteration based on the estimate of $\delta B'$ shown in image 402.

Returning to FIG. 1, at step 118, the smooth function used for modeling $\delta B'$ is updated based on the current temperature map generated at step 116. The smooth function is updated by updating the polynomial vector c. According to an advantageous implementation, at iteration i, $c_i$ is determined by the least square solution of:

$$Xc_i = \Delta B_0^{therm} - \Delta B_0^{bk} - B_c(\Delta T), \quad (8)$$

where $B_c(T) = B_0 \alpha$ T. Accordingly, at each iteration, the smooth polynomial function is updated based on an estimated contribution of the temperature change to the total change in susceptibility in order to attempt to accurately characterize the change in susceptibility ($\delta B'$) due to $B_0$ drift and respiratory motion.

At step 120, it is determined whether the smooth polynomial function has converged. In particular, it is determined whether $|c_i - c_{i-1}| < \epsilon$, where $\epsilon$ is a threshold value. $\epsilon$ can be a predetermined small threshold value, such as $\epsilon = 0.001$. If it is determined that smooth polynomial function has not converged (i.e., $|c_i - c_{i-1}|$ is not less than $\epsilon$), the method returns to step 114, and steps 114, 116, 118, and 120 (i.e., the iterative reconstruction stage 112) are repeated until the smooth polynomial function converged. If it is determined that the smooth polynomial function has converged (i.e., $|c_i - c_{i-1}| < \epsilon$), the iterative reconstruction stage 112 is stopped and the method proceeds to step 122.

At step 122, the final compensated temperature map is output. For example, the compensated temperature map can be output by displaying the compensated temperature map on a display of a computer system to provide real-time temperature monitoring during a thermal therapy procedure. In one possible implementation, since the difference between $c_i$ and $c_{i-1}$ is smaller than the threshold $\epsilon$, the temperature map generated during the final iteration of step 116 can be output as the final temperature map. In another possible implementation, the final temperature map can be reconstructed by modeling $\delta B'$ based on $c_i$ resulting from the final iteration of step 118 using Equation (6) and then generating the final temperature map using equation (7).

Figure 5:
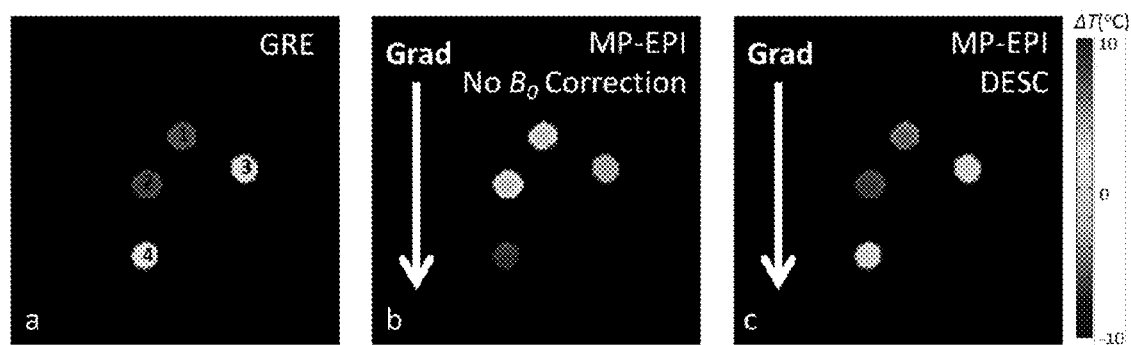
FIG. 5 illustrates exemplary temperature maps resulting from a gel phantom experiment.

FIG. 5 illustrates exemplary temperature maps resulting from a gel phantom experiment. The results of FIG. 5 show that the $B_0$ correction method of FIG. 1 can correct a linear $B_0$ shift created by turning on a gradient of 1 mT/m in the readout direction. To simulate the temperature rise of thermal therapy, gel tubes 1 and 2 were stored in a refrigerator (−1° C.) overnight before the experiment. As a reference, gel tubes 3 and 4 were kept at room temperature (19° C.). The baseline images were acquired immediately after the gel tubes were retrieved from the refrigerator, and a second set of images were acquired 22 minutes after the baseline acquisition to simulate the images acquired during thermal therapy. Gradient echo (GRE) sequence MRI was used as the gold-standard for temperature measurement. The gradient was only turned on when acquiring the second set of images by MP-EPI. Image (a) of FIG. 5 shows a temperature map acquired using GRE. As shown in image (a), for GRE, 10° C. temperature rise was observed from the gel tubes 1 and 2 and 0° C. from gel tubes 3 and 4. Image (b) of FIG. 5 shows a temperature map acquired using MP-EPI without $B_0$ correction. As shown in image (b) MP-EPI without $B_0$ correction shows different temperature values from the GRE temperature map because of the simulated $B_0$ shift by the gradient. Image (c) of FIG. 5 shows a temperature map acquired using MP-EPI with $B_0$ correction using the method of FIG. 1. As shown in image (c), the compensated temperature map shows minimized $B_0$ shift artifact and similar temperature difference values to those in the GRE temperature map.

Figure 6:
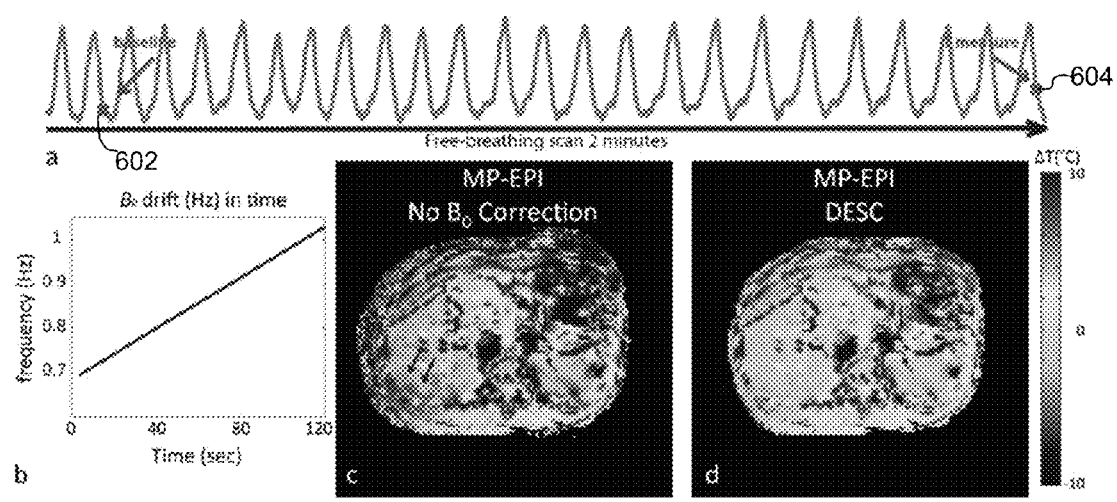
FIG. 6 illustrates exemplary results of the method of FIG. 1 in a human subject experiment.

FIG. 6 illustrates exemplary results of the method of FIG. 1 in a human subject experiment. The results of FIG. 6 show that the $B_0$ correction method of FIG. 1 can minimize the $B_0$ drift and respiratory motion in a human subject. Image (a) of FIG. 6 shows a curve of the respiratory motion during the entire two minute scan. The waveforms shown in image (a) was recorded in synchronous with the image acquisition using a respiratory bellow placed on the chest of the human subject. Image (a) shows the time points 602 and 604 at which the baseline images and the assumed thermal therapy images were acquired, respectively. Image (b) of FIG. 6 shows a plot of $B_0$ drift as a function of time. This plot was extracted from the smooth modeling function. Images (c) and (d) of FIG. 6 show temperature maps acquired without $B_0$ correction and with $B_0$ correction, respectively. As shown in image (c), pronounced artifacts can be observed due to $B_0$ drift and the respiratory motion. As shown in image (d), the artifacts are minimized by the $B_0$ correction method.

Figure 7:
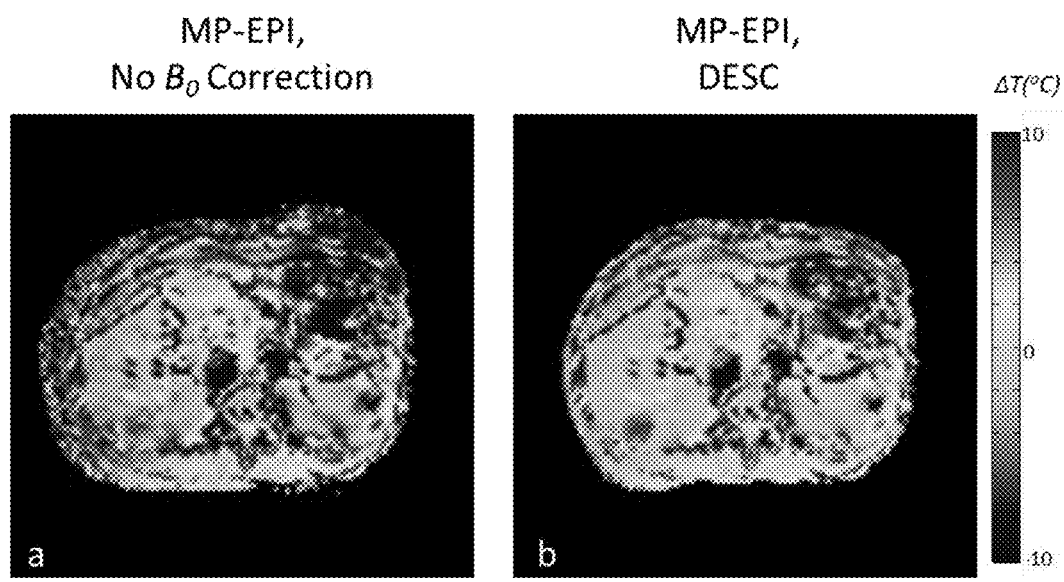
FIG. 7 illustrates temperature maps for a human subject with simulated temperature rise.

To examine the filtering effect of the smooth function modeling on a temperature map, temperature rise was simulated in the phase images of the human subject datasets. For the images acquired at baseline, two synthesized phase images (representing FISP and PSIF, respectively) were generated by adding the baseline images of gel tube 1 to the corresponding baseline phase images of the human subject. Likewise a similar operation was performed for the phase images during the simulated thermal therapy. FIG. 7 illustrates temperature maps for the human subject with the simulated temperature rise. Image (a) of FIG. 7 shows a temperature map acquired using MP-EPI without $B_0$ correction and image (b) of FIG. 7 shows a compensated temperature map acquired using MP-EPI with the $B_0$ correction method of FIG. 1. As shown in images (a) and (b), the $B_0$ correction minimizes the $B_0$ shift artifacts while having limited filtering effects on the simulated thermal dose.

As described above, embodiments of the present invention provide $B_0$ correction for MR thermometry application. However, the present invention is not limited to MR thermometry and embodiments of the present invention can be similarly applied to other applications that use EPI sequences, such as functional MRI, diffusion MRI, and echo-planar based fast imaging.

Figure 8:
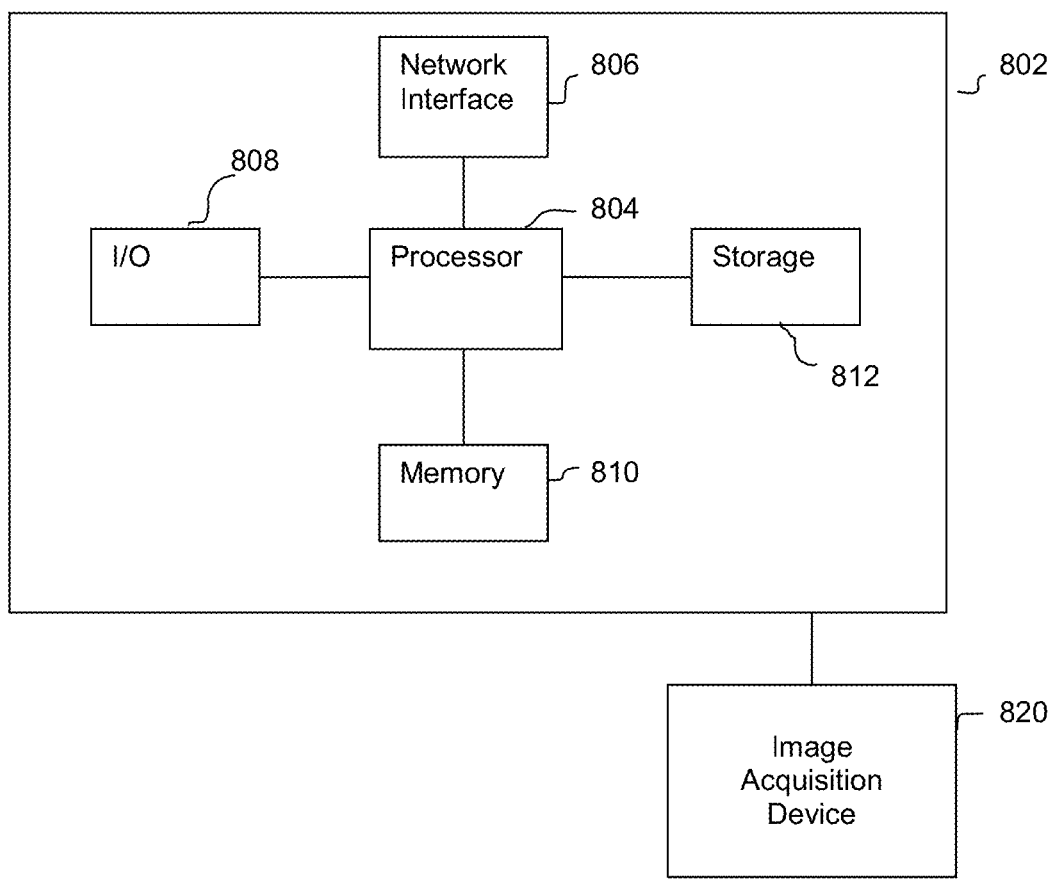
FIG. 8 is a high-level block diagram of a computer capable of implementing the present invention.

The above-described methods for $B_0$ correction in EP based MRI may be implemented on a computer using well-known computer processors, memory units, storage devices, computer software, and other components. A high-level block diagram of such a computer is illustrated in FIG. 8. Computer 802 contains a processor 804, which controls the overall operation of the computer 802 by executing computer program instructions which define such operation. The computer program instructions may be stored in a storage device 812 (e.g., magnetic disk) and loaded into memory 810 when execution of the computer program instructions is desired. Thus, the steps of the method of FIG. 1 may be defined by the computer program instructions stored in the memory 810 and/or storage 812 and controlled by the processor 804 executing the computer program instructions. An image acquisition device 820, such as an MR scanning device, can be connected to the computer 802 to input image data to the computer 802. It is possible to implement the image acquisition device 820 and the computer 802 as one device. It is also possible that the image acquisition device 820 and the computer 802 communicate wirelessly through a network. The computer 802 also includes one or more network interfaces 806 for communicating with other devices via a network. The computer 802 also includes other input/output devices 808 that enable user interaction with the computer 802 (e.g., display, keyboard, mouse, speakers, buttons, etc.). Such input/output devices 808 may be used in conjunction with a set of computer programs as an annotation tool to annotate volumes received from the image acquisition device 820. One skilled in the art will recognize that an implementation of an actual computer could contain other components as well, and that FIG. 8 is a high level representation of some of the components of such a computer for illustrative purposes.

The foregoing Detailed Description is to be understood as being in every respect illustrative and exemplary, but not restrictive, and the scope of the invention disclosed herein is not to be determined from the Detailed Description, but rather from the claims as interpreted according to the full breadth permitted by the patent laws. It is to be understood that the embodiments shown and described herein are only illustrative of the principles of the present invention and that various modifications may be implemented by those skilled in the art without departing from the scope and spirit of the invention. Those skilled in the art could implement various other feature combinations without departing from the scope and spirit of the invention.

The invention claimed is:

1. A method for $B_0$ drift and respiratory motion compensation in echo-planar based magnetic resonance imaging (MRI) comprising:
    obtaining at least two phase images of a target region of a patient from each of a first echo-planar imaging (EPI) acquisition and a second EPI acquisition;
    generating a first susceptibility map based on the at least two phase images of the target region of the patient obtained from the first EPI acquisition and a second susceptibility map based on the at least two phase images of the target region of the patient obtained from the second EPI acquisition;
    initializing a smooth polynomial function for modeling the $B_0$ drift and respiratory motion between the first EPI acquisition and the second EPI acquisition based on the first and second susceptibility maps; and
    iteratively reconstructing a compensated temperature map showing temperature changes in tissue in the target region of the patient based on the smooth polynomial function to compensate for temperature map inaccuracies due to $B_0$ drift and respiratory motion.

2. The method of claim 1, wherein iteratively reconstructing a compensated temperature map showing temperature changes in tissue in the target region of the patient based on the smooth polynomial function to compensate for temperature map inaccuracies due to $B_0$ drift and respiratory motion comprises:

(a) estimating susceptibility changes due to $B_0$ drift and respiratory motion using the smooth polynomial function;
(b) generating a compensated temperature map based on the estimated susceptibility changes due to $B_0$ drift and respiratory motion;
(c) updating the smooth polynomial function based on the compensated temperature map; and
(d) repeating steps (a)-(c) until the smooth polynomial function converges.

3. The method of claim 2, wherein generating a first susceptibility map based on the at least two phase images of the target region of the patient obtained from the first EPI acquisition and a second susceptibility map based on the at least two phase images of the target region of the patient obtained from the second EPI acquisition comprises:
generating the first susceptibility map ($\Delta B_0^{bk}$) as $$\Delta B_0^{bk} = \frac{\phi_1^{bk} - \phi_2^{bk}}{\gamma(TE_1^{bk} - TE_2^{bk})},$$

where $\phi_1^{bk}$ and $\phi_2^{bk}$ are first and second phase images obtained from the first EPI acquisition, $TE_1^{bk}$ and $TE_2^{bk}$ are echo times for $\phi_1^{bk}$ and $\phi_2^{bk}$, respectively, and $\gamma$ is a gyromagnetic ratio; and
generating the second susceptibility map ($\Delta B_0^{therm}$) as $$\Delta B_0^{therm} = \frac{\phi_1^{therm} - \phi_2^{therm}}{\gamma(TE_1^{therm} - TE_2^{therm})},$$

where $\phi_1^{therm}$ and $\phi_2^{therm}$ are first and second phase images obtained from the second EPI acquisition, and $TE_1^{therm}$ and $TE_2^{therm}$ are echo times for $\phi_1^{therm}$ and $\phi_2^{therm}$, respectively.

4. The method of claim 3, wherein initializing a smooth polynomial function for modeling the $B_0$ drift and respiratory motion between the first EPI acquisition and the second EPI acquisition based on the first and second susceptibility maps comprises:
initializing smooth polynomial function (Xc) as $Xc = \Delta B_0^{therm} - \Delta B_0^{bk}$.

5. The method of claim 4, wherein the smooth polynomial function is a fourth order polynomial function and estimating susceptibility changes due to $B_0$ drift and respiratory motion using the smooth polynomial function comprises:
modeling the susceptibility changes ($\delta B'$) due to $B_0$ drift and respiratory motion for an image of n pixels at iteration i as:

$$\delta B' = \begin{pmatrix} 1 & x_0 & y_0 & \cdots & y_0^4 \\ 1 & x_1 & y_1 & \cdots & y_1^4 \\ \vdots & \vdots & \vdots & \ddots & \vdots \\ 1 & x_n & y_n & \cdots & y_n^4 \end{pmatrix} \begin{pmatrix} c_0 \\ c_1 \\ c_2 \\ \vdots \\ c_{15} \end{pmatrix} = Xc_{i-1}$$

where each pixel coordinate is denoted as (x, y) and $c_{i-1}$ is a coefficient vector of the smooth function determined at iteration i−1.

6. The method of claim 5, wherein generating a compensated temperature map based on the estimated susceptibility changes due to $B_0$ drift and respiratory motion comprises:
generating the compensated temperature map at iteration i as:

$$\Delta T(x, y) = \frac{\sum_{p=1}^{2} A_p(x, y)(K^{therm}\phi_p^{therm}(x, y) - K^{bk}\phi_p^{bk} - \gamma TE_p \delta B'(x, y))}{\gamma \alpha B_0 \sum_{p=1}^{2} TE_p A_p(x, y)},$$

where (x, y) represents a 2D coordinate of a pixel of the temperature map, p is an index of pathways in the EPI acquisitions, A is a magnitude image obtained from the second EPI acquisition, $K^{therm}$ and $K^{bk}$ are correction terms calculated as $K^{therm} = B_0/\Delta B_0^{therm}$ and $K^{bk} = B_0/\Delta B_0^{bk}$, respectively, $B_0$ is a constant value for a main magnetic field of an MR imaging device, and $$\alpha = -0.01 \frac{ppm}{^\circ C}.$$

7. The method of claim 6, wherein updating the smooth polynomial function based on the compensated temperature map comprises:
determining the coefficient vector $c_i$ of the smooth polynomial function at iteration i by calculating a least square solution of $Xc_i = \Delta B_0^{therm} - \Delta B_0^{bk} - B_c(\Delta T)$, where $B_c(T) = B_0 \alpha \Delta T$.

8. The method of claim 7, wherein repeating steps (a)-(c) until the smooth polynomial function converges comprises:
repeating steps (a)-(c) until $|c_i - c_{i-1}| < \epsilon$, where $\epsilon$ s a threshold value.

9. The method of claim 1, wherein the first EPI acquisition is a baseline EPI acquisition prior to a thermal therapy procedure and the second EPI acquisition is an EPI acquisition during the thermal therapy procedure, and iteratively reconstructing a compensated temperature map showing temperature changes in tissue in the target region of the patient based on the smooth polynomial function to compensate for temperature map inaccuracies due to $B_0$ drift and respiratory motion comprises:
iteratively reconstructing a compensated temperature map showing temperature changes in tissue in the target region of the patient due to the thermal therapy procedure based on the smooth polynomial function to compensate for temperature map inaccuracies due to $B_0$ drift and respiratory motion.

10. The method of claim 1, wherein the first and second EPI acquisitions are multi-pathway EPI (MP-EPI) acquisitions and obtaining at least two phase images of a target region of a patient from each of a first echo-planar imaging (EPI) acquisition and a second EPI acquisition comprises:
reconstructing a phase image of the target region of the patient from each of a Fast Image with Steady-state Precession (FISP) pathway and a Reversed FISP (PSIF) pathway in each of the first and second EPI acquisitions.

11. The method of claim 2, wherein initializing a smooth polynomial function for modeling the $B_0$ drift and respiratory motion between the first EPI acquisition and the second EPI acquisition based on the first and second susceptibility maps comprises:
initializing the smooth polynomial function as a total susceptibility change between the first and second susceptibility maps.

12. The method of claim 11, wherein updating the smooth polynomial function based on the compensated temperature map comprises:
estimating susceptibility change due to a change in tissue temperature between the first acquisition time and the second acquisition time based on the compensated temperature map; and
updating the smooth polynomial function to model a remaining portion of the to the total susceptibility change between the first and second susceptibility maps other than the estimated susceptibility change due to a change in tissue temperature.

13. An apparatus for $B_0$ drift and respiratory motion compensation in echo-planar based magnetic resonance imaging (MRI) comprising:
a processor; and
a memory storing computer program instructions which when executed by the processor cause the processor to perform operations comprising:
obtaining at least two phase images of a target region of a patient from each of a first echo-planar imaging (EPI) acquisition and a second EPI acquisition;
generating a first susceptibility map based on the at least two phase images of the target region of the patient obtained from the first EPI acquisition and a second susceptibility map based on the at least two phase images of the target region of the patient obtained from the second EPI acquisition;
initializing a smooth polynomial function for modeling the $B_0$ drift and respiratory motion between the first EPI acquisition and the second EPI acquisition based on the first and second susceptibility maps; and
iteratively reconstructing a compensated temperature map showing temperature changes in tissue in the target region of the patient based on the smooth polynomial function to compensate for temperature map inaccuracies due to $B_0$ drift and respiratory motion.

14. The apparatus of claim 13, wherein iteratively reconstructing a compensated temperature map showing temperature changes in tissue in the target region of the patient based on the smooth polynomial function to compensate for temperature map inaccuracies due to $B_0$ drift and respiratory motion comprises:
estimating susceptibility changes due to $B_0$ drift and respiratory motion using the smooth polynomial function;
generating a compensated temperature map based on the estimated susceptibility changes due to $B_0$ drift and respiratory motion;
updating the smooth polynomial function based on the compensated temperature map; and
determining whether the smooth polynomial function has converged.

15. The apparatus of claim 13, wherein the first EPI acquisition is a baseline EPI acquisition prior to a thermal therapy procedure and the second EPI acquisition is an EPI acquisition during the thermal therapy procedure, and iteratively reconstructing a compensated temperature map showing temperature changes in tissue in the target region of the patient based on the smooth polynomial function to compensate for temperature map inaccuracies due to $B_0$ drift and respiratory motion comprises:
iteratively reconstructing a compensated temperature map showing temperature changes in tissue in the target region of the patient due to the thermal therapy procedure based on the smooth polynomial function to compensate for temperature map inaccuracies due to $B_0$ drift and respiratory motion.

16. The apparatus of claim 14, wherein initializing a smooth polynomial function for modeling the $B_0$ drift and respiratory motion between the first EPI acquisition and the second EPI acquisition based on the first and second susceptibility maps comprises:
initializing the smooth polynomial function as a total susceptibility change between the first and second susceptibility maps.

17. The apparatus of claim 16, wherein updating the smooth polynomial function based on the compensated temperature map comprises:
estimating susceptibility change due to a change in tissue temperature between the first acquisition time and the second acquisition time based on the compensated temperature map; and
updating the smooth polynomial function to model a remaining portion of the to the total susceptibility change between the first and second susceptibility maps other than the estimated susceptibility change due to a change in tissue temperature.

18. A non-transitory computer readable medium storing computer program instructions for $B_0$ drift and respiratory motion compensation in echo-planar based magnetic resonance imaging (MRI), the computer program instructions when executed by a processor cause the processor to perform operations comprising:
obtaining at least two phase images of a target region of a patient from each of a first echo-planar imaging (EPI) acquisition and a second EPI acquisition;
generating a first susceptibility map based on the at least two phase images of the target region of the patient obtained from the first EPI acquisition and a second susceptibility map based on the at least two phase images of the target region of the patient obtained from the second EPI acquisition;
initializing a smooth polynomial function for modeling the $B_0$ drift and respiratory motion between the first EPI acquisition and the second EPI acquisition based on the first and second susceptibility maps; and
iteratively reconstructing a compensated temperature map showing temperature changes in tissue in the target region of the patient based on the smooth polynomial function to compensate for temperature map inaccuracies due to $B_0$ drift and respiratory motion.

19. The non-transitory computer readable medium of claim 18, wherein iteratively reconstructing a compensated temperature map showing temperature changes in tissue in the target region of the patient based on the smooth polynomial function to compensate for temperature map inaccuracies due to $B_0$ drift and respiratory motion comprises:
(a) estimating susceptibility changes due to $B_0$ drift and respiratory motion using the smooth polynomial function;
(b) generating a compensated temperature map based on the estimated susceptibility changes due to $B_0$ drift and respiratory motion;
(c) updating the smooth polynomial function based on the compensated temperature map; and
(d) repeating operations (a)-(c) until the smooth polynomial function converges.

20. The non-transitory computer readable medium of claim 19, wherein generating a first susceptibility map based on the at least two phase images of the target region of the patient obtained from the first EPI acquisition and a second susceptibility map based on the at least two phase of the target region of the patient images obtained from the second EPI acquisition comprises:

generating the first susceptibility map ($\Delta B_0^{bk}$) as $$\Delta B_0^{bk} = \frac{\phi_1^{bk} - \phi_2^{bk}}{\gamma(TE_1^{bk} - TE_2^{bk})},$$

where $\phi_1^{bk}$ and $\phi_2^{bk}$ are the first and second phase images obtained from the first EPI acquisition, $TE_1^{bk}$ and $TE_2^{bk}$ are echo times for $\phi_1^{bk}$ and $\phi_2^{bk}$, respectively, and $\gamma$ is a gyromagnetic ratio; and generating the second susceptibility map ($\Delta B_0^{therm}$) as $$\Delta B_0^{therm} = \frac{\phi_1^{therm} - \phi_2^{therm}}{\gamma(TE_1^{therm} - TE_2^{therm})},$$

where $\phi_1^{therm}$ and $\phi_2^{therm}$ are the first and second phase images obtained from the second EPI acquisition, and $TE_1^{therm}$ and $TE_2^{therm}$ are echo times for $\phi_1^{therm}$ and $\phi_2^{therm}$, respectively.

21. The non-transitory computer readable medium of claim 20, wherein initializing a smooth polynomial function for modeling the $B_0$ drift and respiratory motion between the first EPI acquisition and the second EPI acquisition based on the first and second susceptibility maps comprises:

initializing smooth polynomial function (Xc) as $Xc = \Delta B_0^{therm} - \Delta B_0^{bk}$.

22. The non-transitory computer readable medium of claim 21, wherein the smooth polynomial function is a fourth order polynomial function and estimating susceptibility changes due to $B_0$ drift and respiratory motion using the smooth polynomial function comprises:

modeling the susceptibility changes ($\delta B'$) due to $B_0$ drift and respiratory motion for an image of n pixels at iteration i as:

$$\delta B' = \begin{pmatrix} 1 & x_0 & y_0 & \cdots & y_0^4 \\ 1 & x_1 & y_1 & \cdots & y_1^4 \\ \vdots & \vdots & \vdots & \ddots & \vdots \\ 1 & x_n & y_n & \cdots & y_n^4 \end{pmatrix} \begin{pmatrix} c_0 \\ c_1 \\ c_2 \\ \vdots \\ c_{15} \end{pmatrix} = Xc_{i-1}$$

where each pixel coordinate is denoted as (x, y) and $c_{i-1}$ is a coefficient vector of the smooth function determined at iteration i−1.

23. The non-transitory computer readable medium of claim 22, wherein generating a compensated temperature map based on the estimated susceptibility changes due to $B_0$ drift and respiratory motion comprises:

generating the compensated temperature map at iteration i as:

$$\Delta T(x, y) = \frac{\sum_{p=1}^{2} A_p(x, y)(K^{therm}\phi_p^{therm}(x, y) - K^{bk}\phi_p^{bk} - \gamma TE_p \delta B'(x, y))}{\gamma \alpha B_0 \sum_{p=1}^{2} TE_p A_p(x, y)},$$

where (x, y) represents a 2D coordinate of a pixel of the temperature map, p is an index of pathways in the EPI acquisitions, A is a magnitude image obtained from the second EPI acquisition, $K^{therm}$ and $K^{bk}$ are correction terms calculated as $K^{therm} = B_0/\Delta B_0^{therm}$ and $K^{bk} = B_0/\Delta B_0^{bk}$ respectively, $B_0$ is a constant value for a main magnetic field of an MR imaging device, and $$\alpha = -0.01 \frac{ppm}{°C}.$$

24. The non-transitory computer readable medium of claim 23, wherein updating the smooth polynomial function based on the compensated temperature map comprises:

determining the coefficient vector $c_i$ of the smooth polynomial function at iteration i by calculating a least square solution of $Xc_i = \Delta B_0^{therm} - \Delta B_0^{bk} - B_c(\Delta T)$, where $B_c(T) = B_0 \alpha \Delta T$.

25. The non-transitory computer readable medium of claim 18, wherein the first EPI acquisition is a baseline EPI acquisition prior to a thermal therapy procedure and the second EPI acquisition is an EPI acquisition during the thermal therapy procedure and iteratively reconstructing a compensated temperature map showing temperature changes in tissue in the target region of the patient based on the smooth polynomial function to compensate for temperature map inaccuracies due to $B_0$ drift and respiratory motion comprises:

iteratively reconstructing a compensated temperature map showing temperature changes in tissue in the target region of the patient due to the thermal therapy procedure based on the smooth polynomial function to compensate for temperature map inaccuracies due to $B_0$ drift and respiratory motion.

26. The non-transitory computer readable medium of claim 18, wherein the first and second EPI acquisitions are multi-pathway EPI (MP-EPI) acquisitions and obtaining at least two phase images of a target region of a patient from each of a first echo-planar imaging (EPI) acquisition and a second EPI acquisition comprises:

reconstructing a phase image of the target region of the patient from each of a Fast Image with Steady-state Precession (FISP) pathway and a Reversed FISP (PSIF) pathway in each of the first and second EPI acquisitions.

27. The non-transitory computer readable medium of claim 19, wherein initializing a smooth polynomial function for modeling the $B_0$ drift and respiratory motion between the first EPI acquisition and the second EPI acquisition based on the first and second susceptibility maps comprises:

initializing the smooth polynomial function as a total susceptibility change between the first and second susceptibility maps.

28. The non-transitory computer readable medium of claim 27, wherein updating the smooth polynomial function based on the compensated temperature map comprises:

estimating susceptibility change due to a change in tissue temperature between the first acquisition time and the second acquisition time based on the compensated temperature map; and updating the smooth polynomial function to model a remaining portion of the to the total susceptibility change between the first and second susceptibility maps other than the estimated susceptibility change due to a change in tissue temperature.

* * * * *